(12) United States Patent
Kuno (10) Patent No.: US 11,191,200 B2
(45) Date of Patent: Nov. 30, 2021

(54) COMPONENT MOUNTING METHOD

(71) Applicant: FUJI CORPORATION, Chiryu (JP)

(72) Inventor: Koushi Kuno, Ama (JP)

(73) Assignee: FUJI CORPORATION, Chiryu (JP)

( * ) Notice: Subject to any disclaimer, the term of this patent is extended or adjusted under 35 U.S.C. 154(b) by 326 days.

(21) Appl. No.: 16/462,357

(22) PCT Filed: Dec. 6, 2016

(86) PCT No.: PCT/JP2016/086147
§ 371 (c)(1),
(2) Date: May 20, 2019

(87) PCT Pub. No.: WO2018/105030
PCT Pub. Date: Jun. 14, 2018

(65) Prior Publication Data
US 2019/0343028 A1    Nov. 7, 2019

(51) Int. Cl.
*H05K 13/08* (2006.01)
*H05K 13/04* (2006.01)

(52) U.S. Cl.
CPC ....... *H05K 13/0813* (2018.08); *H05K 13/041* (2018.08); *H05K 13/0413* (2013.01); *Y10T 29/49131* (2015.01)

(58) Field of Classification Search
CPC .......... H05K 13/0015; H05K 13/0404; H05K 13/0408; H05K 13/0409; H05K 13/041; H05K 13/0413; H05K 13/0812; H05K 13/0813; Y10T 29/4913; Y10T 29/49131; Y10T 29/49183; Y10T 29/53087;
(Continued)

(56) References Cited

U.S. PATENT DOCUMENTS

2009/0300908 A1 * 12/2009 Endo .............. H05K 13/04
29/739

FOREIGN PATENT DOCUMENTS

JP    2004-304120 A    10/2004
JP    2009-170524 A    7/2009

OTHER PUBLICATIONS

International Search Report dated Mar. 14, 2017 in PCT/JP2016/086147 filed on Dec. 6, 2016.

* cited by examiner

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

The component mounting method is a method for mounting a component using a component mounter including a mounting head, a component camera as an imaging device configured to image a component, a first component holding section provided on the mounting head and capable of holding a first component, and a second component holding section capable of holding a second component at a position lower than the first component, the component mounting method having steps wherein the first component holding section picks up the first component, the imaging device images the first component, the second component holding section picks up the second component while the first component holding section holds the first component, and the second component is imaged while the first component holding section holds the first component and the second component holding section holds the second component.

3 Claims, 6 Drawing Sheets

(58) Field of Classification Search
CPC ......... Y10T 29/53174; Y10T 29/53178; Y10T 29/53191
See application file for complete search history.

COMPONENT MOUNTING METHOD

TECHNICAL FIELD

The present application relates to a method for mounting components.

BACKGROUND ART

A component mounter is known in which components are picked up by multiple component holding sections and mounted on a board. Patent Literature 1 discloses a technique for preventing interference between components picked up by multiple suction nozzles by correcting the offset of the suction position of the components when the components are picked up by each of the multiple suction nozzles.

PATENT LITERATURE

Patent Literature 1: JP-A-2004-304120

BRIEF SUMMARY

Technical Problem

Based on the technique described in Patent Document 1, when a component to be mounted on a board is a large-sized component in which interference between components cannot be avoided by offset correction of the suction position, multiple suction nozzles cannot pick up the large-sized component and other components simultaneously.

An object of the present disclosure is to provide a component mounting method that enables efficient mounting of components.

Solution to Problem

The component mounting method disclosed in this specification is a method for mounting components using a component mounter having: a mounting head configured to pick up a component supplied to a component supply position and mount the component on a board conveyed to a board conveyance position; an imaging device configured to image the component; a first component holding section provided on the mounting head and capable of holding a first component; and a second component holding section capable of holding a second component at a position lower than the first component. Further, the component mounting method disclosed in this specification has: a step of picking up the first component with the first component holding section, a step of imaging the first component with the imaging device, a step of picking up the second component with the second component holding section while the first component holding section holds the first component, and a step of imaging the second component with the imaging device while the first component holding section holds the first component and the second component holding section holds the second component.

With the component mounting method disclosed in this specification, since the second component holding section holds the second component at a position lower than the first component, interference between the first component and the second component can be prevented even when the second component is large in size. Thus, the component mounter is able to perform the component mounting operation in an efficient manner.

DESCRIPTION OF EMBODIMENTS

Embodiments, to which the component mounting method disclosed in this specification is applied, will be described below with reference to the drawings.

1. First Embodiment

1-1. Configuration of Component Mounter 1

Figure 1:
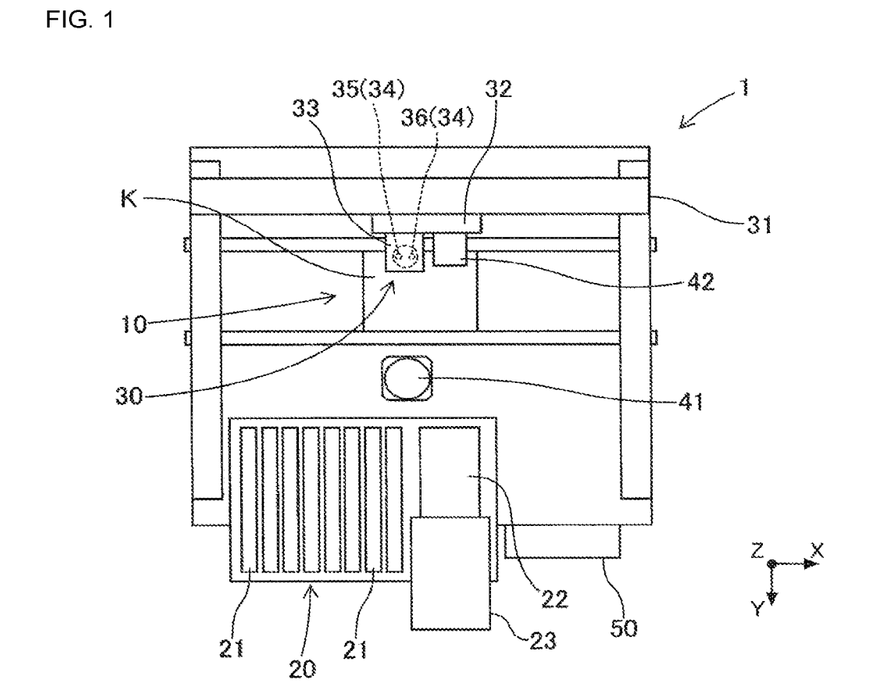
FIG. 1 is a schematic diagram of a component mounter used in a component mounting method of a first embodiment of the present disclosure.

First, an outline of component mounter 1 will be described with reference to FIG. 1. As shown in FIG. 1, component mounter 1 includes board conveyance device 10, component supply section 20, component transfer device 30, component camera 41, board camera 42, and control device 50. In FIG. 1, the conveyance direction of board K is defined as the X-axis direction (i.e., the left-right direction in FIG. 1), the horizontal direction perpendicular to the X-axis direction (i.e., the up-down direction in FIG. 1) is defined as the Y-axis direction, and the direction orthogonal to the X-axis direction and the Y-axis direction (i.e., the direction perpendicular to the sheet in FIG. 1) is defined as the Z-axis direction.

Board conveyance device 10 is configured with a belt conveyor or the like and sequentially transfers boards K in the X-axis direction. Board conveyance device 10 positions board K at a predetermined position inside component mounter 1 (hereinafter referred to as the "board conveyance position"), and when the mounting process of the component to board K is completed, board K is carried out of component mounter 1.

Component supply section 20 has multiple slots disposed side by side in the X-axis direction. Feeders 21 are detachably set in each of the multiple slots. Each feeder 21 feeds and moves a carrier tape to supply the component to a component supply position at the leading end of feeder 21 (Upper part of FIG. 1). Component supply section 20 stores multiple trays 22 on storage shelf 23 partitioned in the vertical direction, draws out predetermined tray 22 in accordance with the mounting process, and supplies components to the component supply position.

Component transfer device 30 includes head driving device 31, moving table 32, mounting head 33, and multiple component holding sections 34. Head driving device 31 is configured to move moving table 32 in the X-axis and Y-axis directions by a linear-movement mechanism. Mounting head 33 picks up the component supplied to the component supply position and mounts the component to board K conveyed to the board conveyance device. Mounting head 33 is detachably mounted on moving table 32 and moves between the component supply position, a board conveyance position, and an imaging position where the component can be imaged by component camera 41.

Component holding section 34 is a nozzle capable of holding a component by suction, and the multiple component holding sections 34 are detachably mounted to the mounting head 33. Each component holding section 34 is supported by mounting head 33 so as to be rotatable about an axis parallel to the Z-axis and able to move up and down in the Z-axis direction.

Component camera 41 and board camera 42 are imaging devices, such as CCD and CMOS, which have imaging elements. Component camera 41 and board camera 42 capture images with ranges that fall within the camera field of view based on a control signal from control device 50 connected so as to be able to communicate with each other. Component camera 41, with an optical axis facing upward in the Z-axis direction, is set up to image the component held by component holding section 34 from below. Board camera 42 is provided so that the optical axis faces downward in the Z-axis direction with respect to moving table 32 and captures an image of board K positioned at the board conveyance position from above. Component camera 41 and board camera 42 transmit image data acquired by imaging to control device 50.

Control device 50 controls the movement of mounting head 33, the suction operation of component holding section 34 and the like based on image data acquired from component camera 41 and board camera 42, information outputted from various sensors provided in component mounting device 1, and the like.

Figure 2:
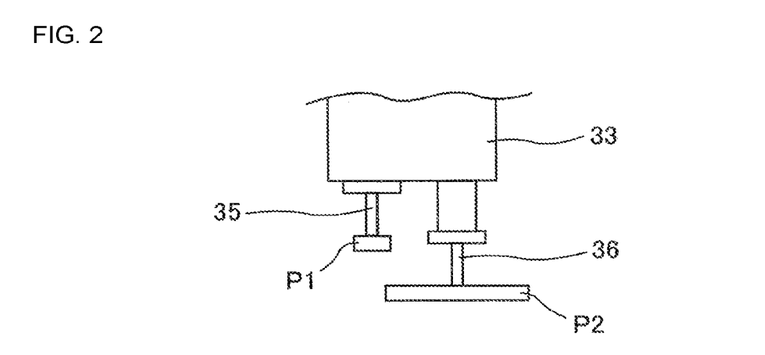
FIG. 2 is an enlarged front view of a portion of the mounting head, showing a state in which a first component is held in a first component holding section and a second component is held in a second component holding section.

As shown in FIG. 2, mounting head 33 has two component holding sections 34. Of the two component holding sections 34, one component holding section 34 (hereinafter referred to as "first component holding section 35") holds the component at a higher position than the other component holding section 34 (hereinafter referred to as "second component holding section 36"). With this configuration, it is possible to prevent the component held by first component holding section 35 (hereinafter referred to as "first component P1") and the component held by second component holding section 36 (hereinafter referred to as "second component P2, P21, P22") from interfering with each other.

With such a configuration, for example, even if second component P2 is larger than first component P1, and first component P1 and second component P2 would interfere with each other if they were held at the same height, mounting head 33 can hold first component P1 and second component P2 simultaneously.

In the present embodiment, a case where mounting head 33 has two component holding sections 34 is described as an example, but mounting head 33 may have three or more component holding sections 34.

1-2. Component Mounting Process 1

Next, component mounting process 1 executed by control device 50 will be described with reference to FIG. 3. Component mounting process 1 is an example of a process in which mounting head 33 picks up components of feeder 21 and components supplied to the component supply position of tray 22, and mounts the components to board K conveyed to the board conveyance position.

Figure 3:
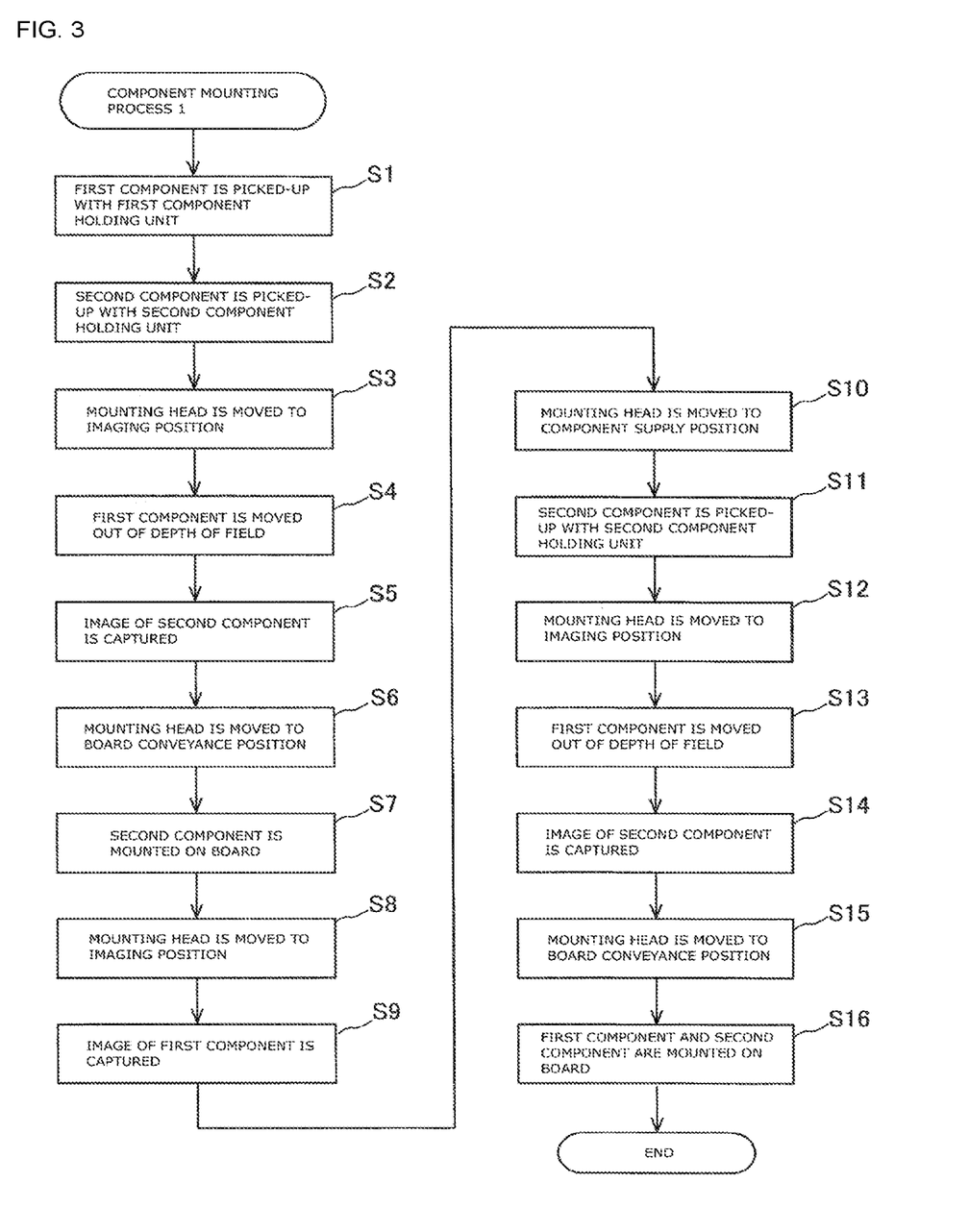
FIG. 3 is a flow chart showing component mounting process 1 performed by a control device.
Figure 4:
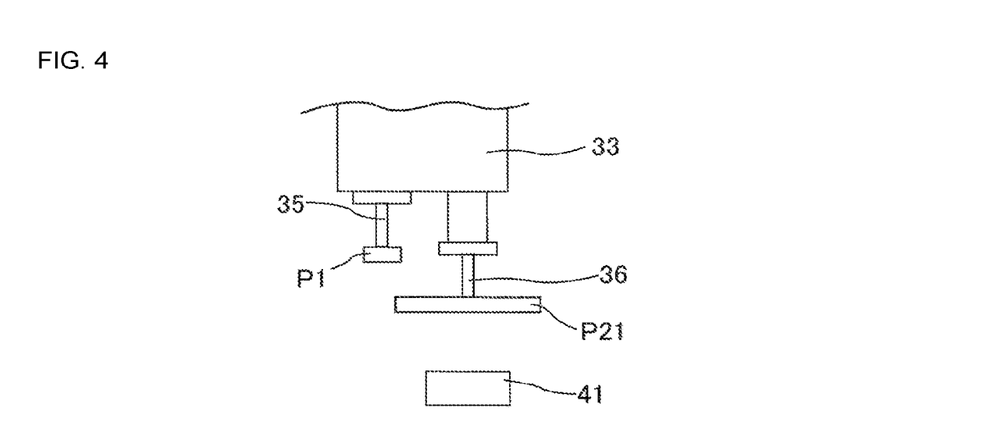
FIG. 4 is an enlarged front view of a portion of the mounting head, showing a state in which, after the first component and the second component supplied to the component supply position are picked up, the mounting head is moved to a position where the second component can be imaged.

As shown in FIGS. 3 and 4, in component mounting process 1, control device 50 moves mounting head 33 to the component supply position on feeder 21. Control device 50 then lowers first component holding section 35 with respect to mounting head 33 and causes first component holding section 35 to pick up first component P1 (S1). Subsequently, control device 50 moves mounting head 33 to the component supply position on tray 22. Second component holding section 36 is lowered with respect to mounting head 33, and second component P21 is picked up by second component holding section 36 (S2).

Next, control device 50 moves mounting head 33 to the imaging position (S3). After moving first component P1 out of the depth of field of component camera 41 (S4), control device 50 captures an image of second component P21 with component camera 41 (S5). As a result, control device 50 can obtain an imaging result in which component camera 41 images second component P21. In the process of S4, the timing of moving first component P1 out of the depth of field is not limited to moving first component P1 to the imaging position but may be before moving to the imaging position is completed.

Figure 5:
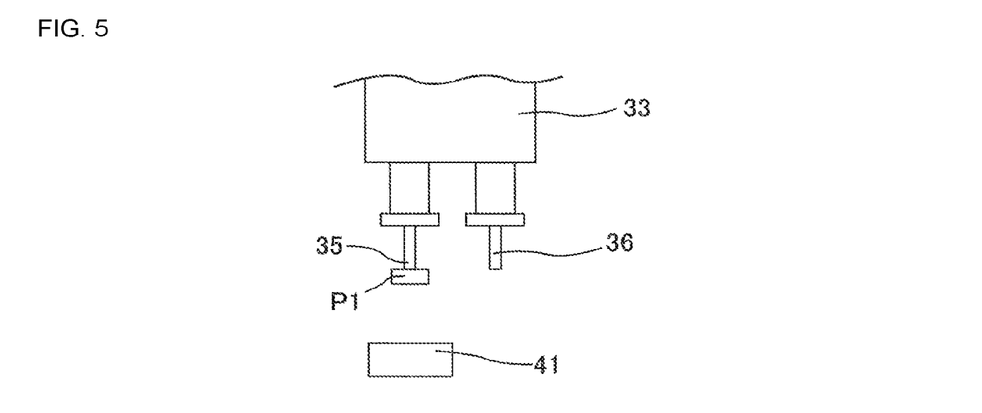
FIG. 5 is an enlarged front view of a portion of the mounting head, showing a state in which, after the second component is mounted to a board conveyed to a board conveyance position, the mounting head is moved to a position where the first component can be imaged.

As shown in FIGS. 3 and 5, control device 50 moves mounting head 33 above board K after imaging of second component P21 is completed (S6). Control device 50 then lowers second component holding section 36 with respect to mounting head 33 and mounts only second component P21 held by second component holding section 36 onto board K (S7). Next, control device 50 moves mounting head 33 to the imaging position while holding first component P1 with first component holding section 35 (S8). Control device 50 moves first component P1 held by first component holding section 35 into the depth of field and then captures an image with component camera 41 (S9).

Figure 6:
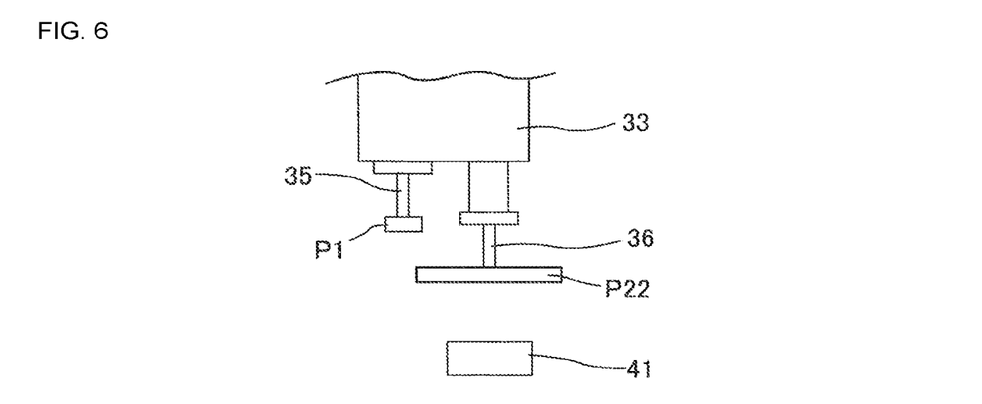
FIG. 6 is an enlarged front view of a portion of the mounting head, showing a state in which, after the second component supplied to a component supply position is picked up, the mounting head is moved to a position where the second component can be imaged.

Next, as shown in FIGS. 3 and 6, after imaging first component P1, control device 50 moves mounting head 33 to the component supply position on tray 22 (S10). Control device 50 lowers second component holding section 36 with respect to the mounting head 33 while holding first component P1 with first component holding section 35 and picks up second component P22, supplied to the component supply position on tray 22, with second component holding section 36 (S11). Thereafter, control device 50 moves mounting head 33 to the imaging position (S12). Thereafter, control device 50 moves first component P1 out of the depth of field of component camera 41 (S13) and images second component P22 with component camera 41 (S14).

Next, as shown in FIG. 3, control device 50 moves mounting head 33 from the imaging position to a position above board K (S15). Control device 50 lowers second component holding section 36 with respect to mounting head 33 and mounts second component P22 onto the board K first. Continuing, control device 50 then lowers first component holding section 35 with respect to mounting head 33 and mounts first component P1 onto board K (S16).

In this way, in component mounting process 1, component mounter 1 can mount three components to board K while mounting head 33 goes back and forth two times between the component supply position and the component conveyance position. In particular, since component mounter 1 can hold second components P21, P22 at positions lower than first component P1, even if second components P21, P22 are large-sized components, interference between first component P1 and second component P2 can be avoided. Therefore, component mounter 1 can efficiently perform the mounting operation of the component.

Further, in component mounting process 1, even when second components P21, P22 are imaged in a state in which first component holding section 35 holds first component P1 and second component holding section 36 simultaneously holds each of second components P21, P22, control device 50 can obtain suitable imaging results of second components P21, P22. As a result, component mounter 1 can mount second components P21, P22 at suitable positions with respect to board K.

2. Second Embodiment

Figure 7:
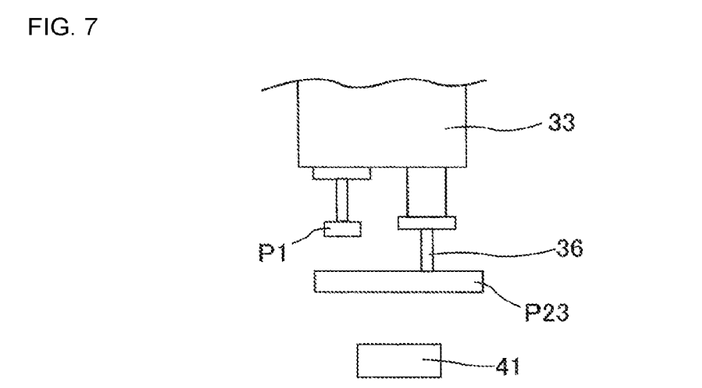
FIG. 7 is an enlarged front view of a portion of a mounting head of a second embodiment showing a state in which a second component is moved to a position where the second component can be imaged.

Next, a second embodiment will be described. In the second embodiment, when viewed from component camera 41, first component P1 held by component holding section 35 is hidden by second component P23 held by second component holding section 36.

As shown in FIG. 7, in the second embodiment, when second component P23 is held by second component holding section 36 while first component P1 is held by first component holding section 35 (corresponding to S2 and S11 executed in component mounting process 1 of the first embodiment), second component holding section 36 holds second component P23 so that first component P1 is not visible from below due to second component P23. Specifically, second component holding section 36 holds second component P23 at a position offset from the center of second component P23 so that first component P1 is not imaged when second component P23 is imaged by component camera 41. As a result, control device 50 can obtain an imaging result in which component camera 41 images second component P23.

3. Third Embodiment

Figure 8:
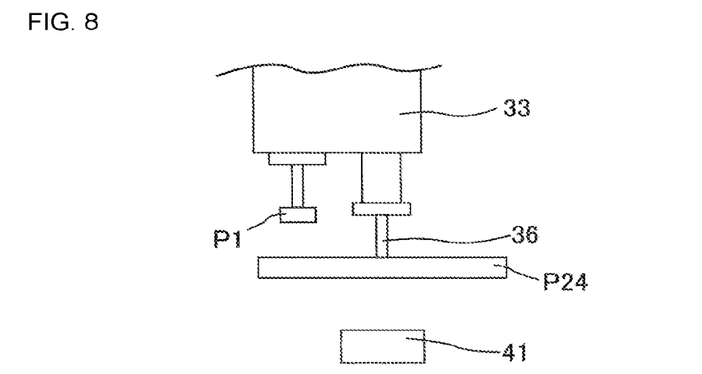
FIG. 8 is an enlarged front view of a portion of a mounting head of a third embodiment showing a state in which, after a first component and a second component supplied to a component supply position have been picked up, the second component is moved to a position where the second component can be imaged.

Next, a third embodiment will be described. In the third embodiment, second component holding section 36 rotates held second component P24 around an axis parallel to the Z-axis direction, thereby hiding first component P1 with second component P23. Second component P24 has a substantially rectangular shape in plan view.

As shown in FIG. 8, in the third embodiment, while first component holding section 35 holds first component P1 and second component holding section 36 holds second component P24, control device 50 rotates second component holding section 36 about an axis parallel to the Z-axis direction with respect to mounting head 33. Control device 50 then changes the orientation of second component P24 so that first component P1 is not visible from below. As a result, when second component P24 is imaged by component camera 41, first component P1 is prevented from being imaged so that control device 50 can obtain an imaging result in which component camera 41 images second component P24.

4. Fourth Embodiment

Figure 9:
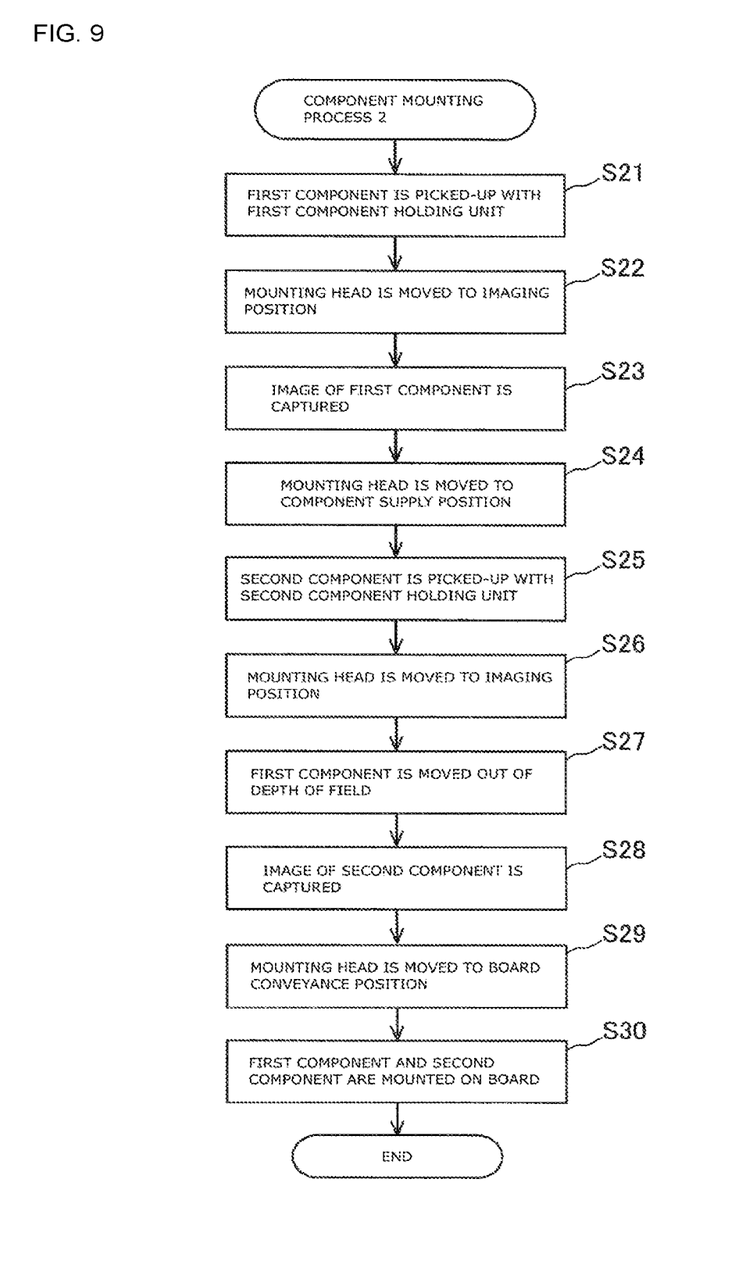
FIG. 9 is a flowchart showing component mounting process 2 executed by a control device in a component mounting method of a fourth embodiment.

Next, a fourth embodiment will be described. In component mounting process 1 of the first embodiment, the three components are conveyed from the component supply position to the board conveyance position while the mounting head 33 goes back and forth two times between the component supply position and the board conveyance position. On the other hand, in component mounting process 2 of the fourth embodiment, the two components are conveyed from the component supply position to the board conveyance position while mounting head 33 goes back and forth once between the component supply position and the board conveyance position.

Figure 10:
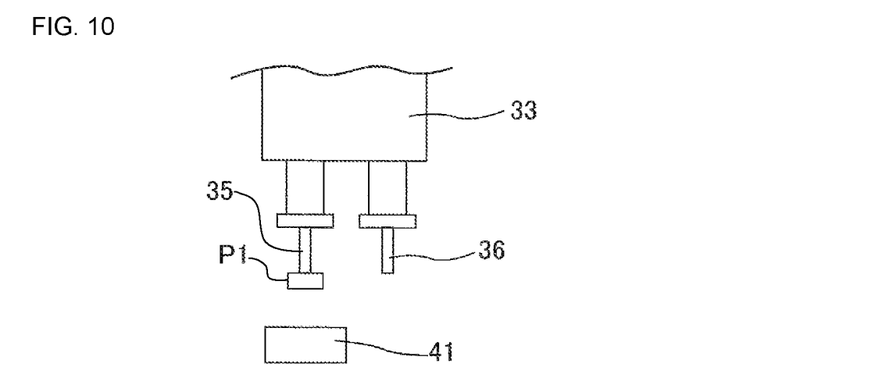
FIG. 10 is an enlarged front view of a portion of a mounting head showing a state in which, after a first component supplied to a component supply position has been picked up, the mounting head is moved to a position where the first component can be imaged.

As shown in FIGS. 9 and 10, in component mounting process 2 of the fourth embodiment, control device 50 moves mounting head 33 to the component supply position on feeder 21 and then lowers first component holding section 35 with respect to mounting head 33 and picks up first component P1 on feeder 21 with first component holding section 35 (S21). Next, control device 50 moves mounting head 33 to the imaging position in a state in which first component holding section 35 holds first component P1 and second component holding section 36 does not hold second component P25 (S22). Control device 50 causes component camera 41 to image first component P1 held by first component holding section 35 (S23).

Figure 11:
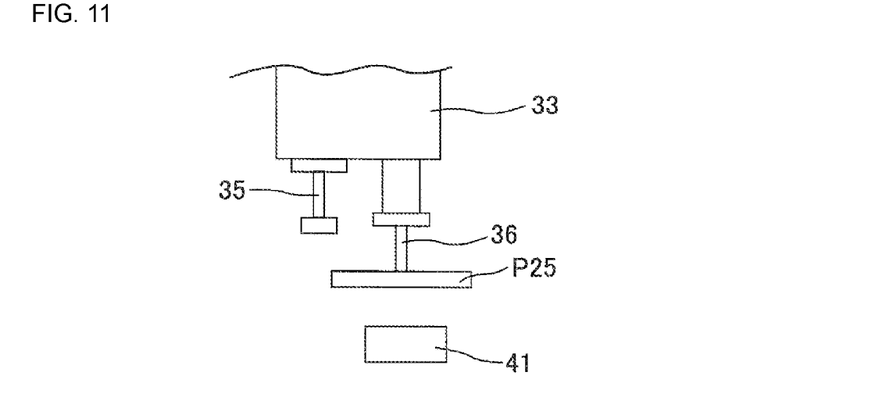
FIG. 11 is an enlarged front view of a portion of the mounting head, showing a state in which, after a second component supplied to the component supply position is picked up, the mounting head is moved to a position where the second component can be imaged.

Next, as shown in FIGS. 9 and 11, control device 50 moves mounting head 33 from the imaging position to the component supply position on tray 22 (S24). Control device 50 lowers second component holding section 36 with respect to mounting head 33 while holding first component P1 with first component holding section 35 and picks up second component P25 with second component holding section 36 (S25). Next, control device 50 moves mounting head 33 to the imaging position in a state in which first component holding section 35 holds first component P1 and second component holding section 36 holds second component P25 (S26). After moving first component P1 out of the depth of field of component camera 41 (S27), control device 50 captures an image of second component P25 with component camera 41 (S28).

Figure 12:
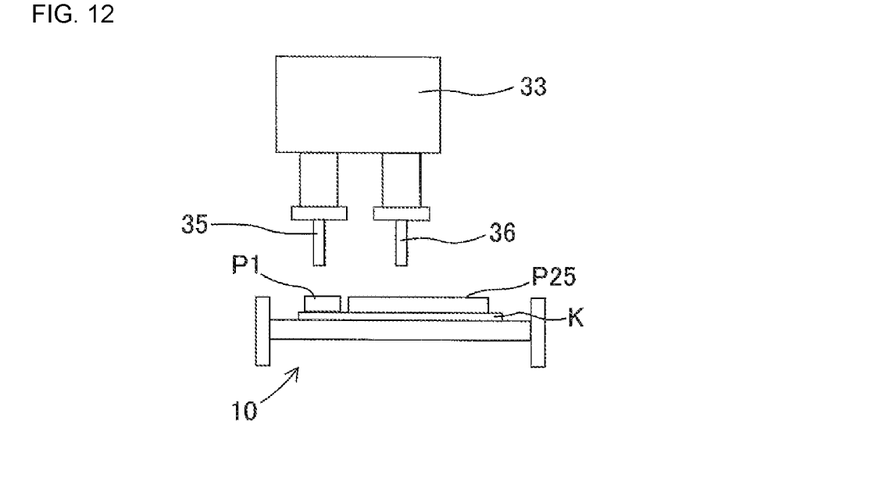
FIG. 12 is an enlarged front view of a portion of the mounting head showing a state in which the first component is mounted to a board after the second component is mounted to the board conveyed to a board conveyance position.

Next, as shown in FIGS. 9 and 12, control device 50 moves mounting head 33 from the imaging position to a position above board K (S29). Control device 50 then lowers second component holding section 36 with respect to mounting head 33 and mounts second component P25 onto board K first. Continuing, control device 50 then lowers first component holding section 35 with respect to mounting head 33 and mounts first component P1 to board K (S30).

As described above, in component mounting process 2, component mounter 1 can mount the two components on board K while mounting head 33 goes back and forth once between the component supply position and the component conveyance position so that component mounter 1 can efficiently perform the mounting operation of the components.

Although the present disclosure has been described based on the above-mentioned embodiments, the configuration of the present disclosure is not limited to the above-mentioned embodiments, and it can be easily inferred that various modifications and improvements can be made within the scope of the disclosure without departing from the spirit of the disclosure.

For example, in component mounting process 1 of the first embodiment, a case in which second component P21 picked up in the process of S2 and the second component P22 picked up in the process of S11 are the same component was described as an example. However, the configuration of the present disclosure is not limited to this, and the two second components P21 and P22 may be different components.

REFERENCE SIGNS LIST

1: Component mounter, 33: Mounting head, 35: First component holding section, 36: Second component holding section, 41: Component camera (imaging device), 50: control device, K: board, P1: First component, P2, P21, P22, P23, P24, P25: second component

The invention claimed is:

1. A component mounting method, using a component mounter comprising:
   a mounting head configured to pick up a component supplied to a component supply position and mount the component on a board conveyed to a board conveyance position;
   an imaging device configured to image the component;
   a first component holding section provided on the mounting head and capable of holding a first component; and
   a second component holding section capable of holding a second component at a position lower than the first component;
   the component mounting method comprising:
   a step of picking up the first component with the first component holding section;
   a step of imaging the first component with the imaging device;
   a step of picking up the second component with the second component holding section while the first component holding section holds the first component; and
   a step of imaging the second component with the imaging device while the first component holding section holds the first component and the second component holding section holds the second component, and the second component is caused to hide the first component as viewed from the imaging device.

2. The component mounting method of claim 1, further comprising:
   a step of mounting the first component and the second component on a board based on an imaging result of the imaging device.

3. The component mounting method of claim 1, further comprising:
   a step of moving the first component out of the depth of field of the imaging device when the imaging device images the second component while the first component holding section holds the first component and the second component holding section holds the second component.

* * * * *